US006961552B2

(12) United States Patent
Darabi et al.

(10) Patent No.: US 6,961,552 B2
(45) Date of Patent: Nov. 1, 2005

(54) LNA GAIN ADJUSTMENT FOR INTERMODULATION INTERFERENCE REDUCTION

(75) Inventors: Hooman Darabi, Long Beach, CA (US); John Leete, Los Angeles, CA (US)

(73) Assignee: Broadcom Corporation, Irvine, CA (US)

( * ) Notice: Subject to any disclaimer, the term of this patent is extended or adjusted under 35 U.S.C. 154(b) by 471 days.

(21) Appl. No.: 10/138,752

(22) Filed: May 3, 2002

(65) Prior Publication Data

US 2003/0181180 A1 Sep. 25, 2003

Related U.S. Application Data

(60) Provisional application No. 60/367,904, filed on Mar. 25, 2002.

(51) Int. Cl.7 .................................................. H04B 1/06

(52) U.S. Cl. ................................ 455/241.1; 455/250.1; 375/345

(58) Field of Search ........................... 455/232.1, 241.1, 455/234.1, 240.1, 245.1, 249.1, 250.1; 375/345

(56) References Cited

U.S. PATENT DOCUMENTS

| | | | | | |
|---|---|---|---|---|---|
| 5,203,012 | A | * | 4/1993 | Patsiokas et al. | 455/513 |
| 5,369,792 | A | * | 11/1994 | Matsumoto et al. | 455/245.1 |
| 5,507,023 | A | * | 4/1996 | Suganuma et al. | 455/234.1 |
| 5,758,273 | A | * | 5/1998 | Marks | 455/240.1 |
| 5,862,465 | A | * | 1/1999 | Ou | 455/234.1 |
| 6,052,466 | A | * | 4/2000 | Wright | 380/262 |
| 6,731,703 | B2 | * | 5/2004 | Kurihara | 375/345 |
| 6,804,501 | B1 | * | 10/2004 | Bradley et al. | 455/138 |
| 2001/0046867 | A1 | * | 11/2001 | Mizoguchi | 455/452 |

* cited by examiner

*Primary Examiner*—Nguyen T. Vo
*Assistant Examiner*—Nhan T. Le
(74) *Attorney, Agent, or Firm*—Garlick Harrison & Markison, LLP; James A. Harrison

(57) ABSTRACT

The radio receiver includes a low noise amplifier that amplifies a received signal to one of three different gain settings. One gain setting is maximum amplification, a second gain setting is 6 dB below maximum amplification and a third gain setting is 32 dB below maximum amplification. In the case of the third setting, the low noise amplifier actually attenuates the received signal by 6 dB. The radio receiver includes a pair of received signal strength indicators that provide received signal strength indications to logic circuitry. Responsive to the received signal strength indications, the logic circuitry generates control commands to the low noise amplifier to prompt it to amplify at one of the three specified levels. Generally, if the received signal has a gain level that exceeds a specified threshold, the low noise amplifier actually attenuates the received signal; otherwise, the level of amplification that is actually provided is a function of the presence of intermodulation interference.

23 Claims, 7 Drawing Sheets

LNA GAIN ADJUSTMENT FOR INTERMODULATION INTERFERENCE REDUCTION

CROSS-REFERENCE TO RELATED APPLICATIONS

This application claims priority to and incorporates by reference U.S. Provisional Application entitled, "Method and Apparatus for a Radio Transceiver", having a Ser. No. of 60/367,904 and a filing date of Mar. 25, 2002, and the Utility Patent Application filed concurrently herewith entitled, "Low Noise Amplifier (LNA) Gain Switch Circuitry" by the inventor Hooman Darabi, having a Ser. No. of 10/138,601 and a filing date of May 3, 2002.

BACKGROUND

1. Field of the Invention

This invention relates generally to wireless communications and, more particularly, to the operation of a Radio Frequency (RF) receiver within a component of a wireless communication system.

2. Description of the Related Art

The structure and operation of wireless communication systems are generally known. Examples of such wireless communication systems include cellular systems and wireless local area networks, among others. Equipment that is deployed in these communication systems is typically built to support standardized operations, i.e., operating standards. These operating standards prescribe particular carrier frequencies, modulation types, baud rates, physical layer frame structures, MAC layer operations, link layer operations, etc. By complying with these operating standards, equipment interoperability is achieved.

In a cellular system, a regulatory body typically licenses a frequency spectrum for a corresponding geographic area (service area) that is used by a licensed system operator to provide wireless service within the service area. Based upon the licensed spectrum and the operating standards employed for the service area, the system operator deploys a plurality of carrier frequencies (channels) within the frequency spectrum that support the subscribers' subscriber units within the service area. Typically, these channels are equally spaced across the licensed spectrum. The separation between adjacent carriers is defined by the operating standards and is selected to maximize the capacity supported within the licensed spectrum without excessive interference. In most cases, severe limitations are placed upon the amount of adjacent channel interference that maybe caused by transmissions on a particular channel.

In cellular systems, a plurality of base stations is distributed across the service area. Each base station services wireless communications within a respective cell. Each cell may be further subdivided into a plurality of sectors. In many cellular systems, e.g., Global System for Mobile Communications (GSM) cellular systems, each base station supports forward link communications (from the base station to subscriber units) on a first set of carrier frequencies, and reverse link communications (from subscriber units to the base station) on a second set of carrier frequencies. The first set and second set of carrier frequencies supported by the base station are a subset of all of the carriers within the licensed frequency spectrum. In most, if not all, cellular systems, carrier frequencies are reused so that interference between base stations using the same carrier frequencies is minimized and system capacity is increased. Typically, base stations using the same carrier frequencies are geographically separated so that minimal interference results.

Both base stations and subscriber units include RF receivers. Radio frequency receivers service the wireless links between the base stations and subscriber units. The RF transmitter receives a baseband signal from a baseband processor, converts the baseband signal to an RF signal, and couples the RF signal to an antenna for transmission. In most RF transmitters, because of well-known limitations, the baseband signal is first converted to an Intermediate Frequency (IF) signal and then the IF signal is converted to the RF signal. Similarly, the RF receiver receives an RF signal, down converts the RF signal to an IF signal and then converts the IF signal to a baseband signal. In other systems, the received RF signal is converted directly to a baseband signal.

One problem in down converting a received RF or IF signal that particularly causes difficulty is that of intermodulation interference. More specifically, a single interference signal in an adjacent channel does not typically introduce a significant amount of interference because its effects may be filtered out or minimized. However, if a plurality of interference signals are present in adjacent channels, then the interaction of each of the interference signals may cumulate to create intermodulation interference in the present channel being used to receive a specified communication signal. Such interference is often referred to as a third order product and is desirably filtered to reduce or eliminate the effect upon the communication signals in the present channel.

There is a need in the art, therefore, for a low power RF receiver that provides gain level settings in a manner that reduces the effects of intermodulation interference.

SUMMARY OF THE INVENTION

A low noise amplifier in a receiver stage of a radio receiver is coupled to receive wireless radio transmissions, as well as control signals from logic circuitry, to prompt the low noise amplifier to select a gain level according to the signal strength of a received signal and the amount of interference being detected from adjacent channels.

More specifically, a pair of received signal strength indicators (RSSIs) is coupled to enable logic circuitry to determine the amount of interference that is present and the signal strength of the received signal. A first RSSI is coupled to detect a total signal strength, meaning the gain of the desired signal summed with the gain of any interference signals, while a second RSSI is coupled to detect only the gain of the received signal on the output stage of a low pass filter. Based on the received signal strength indications from the first and second RSSIs, a logic circuit determines whether the low noise amplifier should provide an output signal having a first, a second or a third gain level. In one embodiment of the invention, the first gain level is full amplification. A second gain level is equal to full amplification attenuated by 6 dB. A third gain level is equal to full amplification attenuated by 32 dB.

More generally, the present invention provides for full amplification if the desired signal level and interference level is low. On the other hand, if the desired signal level exceeds a specified threshold, then the amplification level is attenuated by 32 dB. One reason that the received communication signal is attenuated by 32 dB relative to maximum amplification is to avoid saturation of the amplifiers in the output stages of the radio receiver. Generally, the invention recognizes that the preliminary processing of the received RF introduces gain in several stages. First, the low noise amplifier receiving the RF signal from an antenna can produce, in one embodiment of the invention, up to 26 dB of gain. A mixer, in one embodiment, can provide an additional 6 dB of gain, while a subsequent low pass filter that produces only the desired signal to the second RSSI provides an additional 12 dB of gain. Because the total signal swing that is to be produced to the baseband processing circuitry should have 5 dBm or less, the present invention modifies the gain of the low noise amplifier at the input stage according to the interference conditions and the signal strength of the received signal. Thus, if the intermodulation interference from adjacent channels is low or undetectable and the signal strength of the desired signal is low, then the LNA is allowed to produce maximum gain.

As described before, in one embodiment of the present invention, maximum gain for the LNA is equal to 26 dB. If the desired signal strength is low but intermodulation interference beyond a specified threshold is detected, the gain of the LNA is set to 20 dB or is attenuated 6 dB relative to maximum amplification. If, on the other hand, the received signal has a signal strength that surpasses a specified threshold, then the LNA actually attenuates or reduces the received signal strength by 6 dB to a value of 32 dB below maximum amplification in the described embodiment of the invention, regardless of the signal strength of the intermodulation interference.

Other features and advantages of the present invention will become apparent from the following detailed description of the invention made with reference to the accompanying drawings.

BRIEF DESCRIPTION OF THE DRAWINGS

These and other features, aspects and advantages of the present invention will be more fully understood when considered with respect to the following detailed description, appended claims and accompanying drawings wherein:

DETAILED DESCRIPTION OF THE DRAWINGS

Figure 1A:
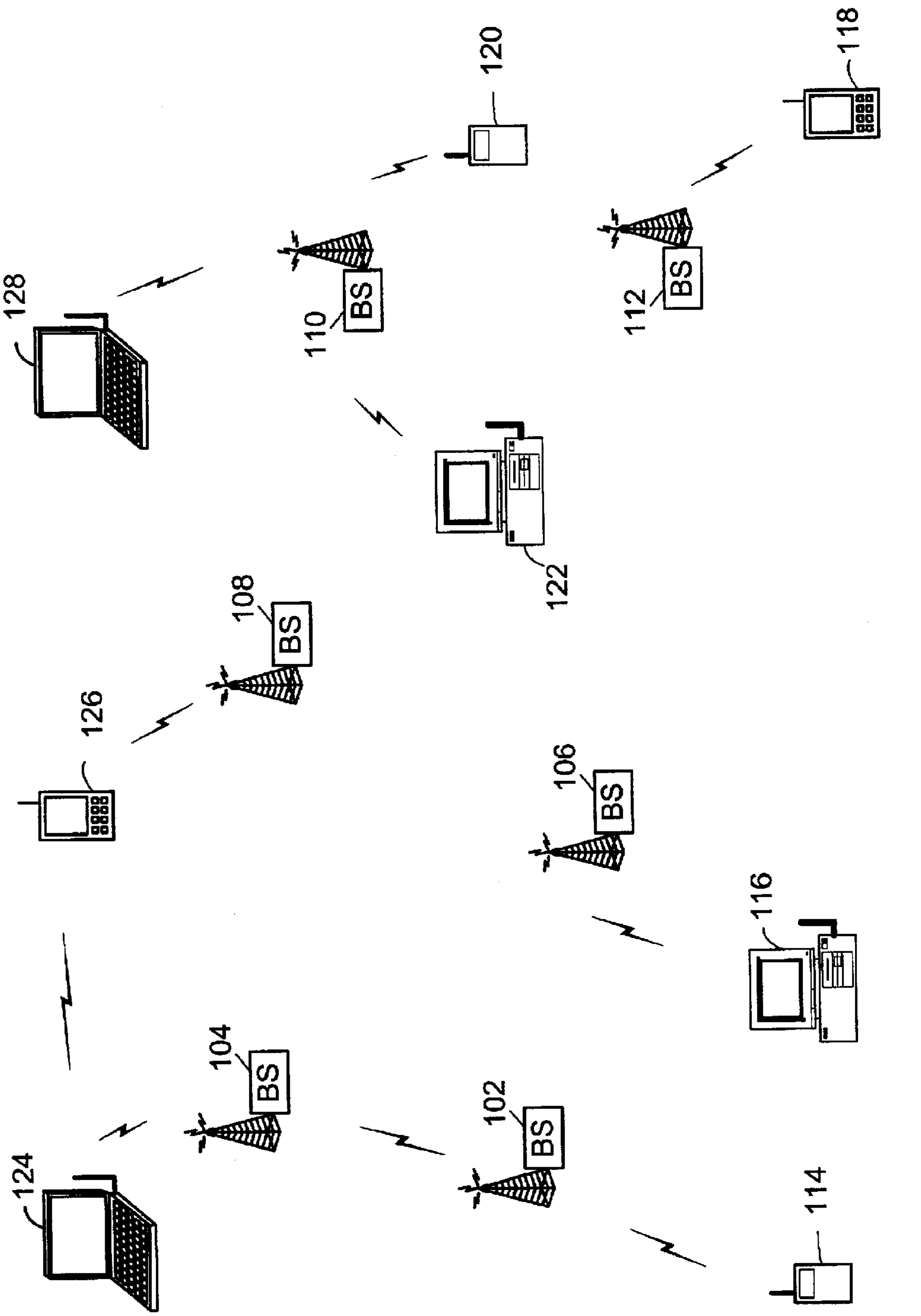
FIG. 1A is a system diagram illustrating a cellular system within which the present invention is deployed.

FIG. 1A is a system diagram illustrating a cellular system within which the present invention is deployed. The cellular system includes a plurality of base stations 102, 104, 106, 108, 110, and 112 that service wireless communications within respective cells, or sectors. The cellular system services wireless communications for a plurality of wireless subscriber units. These wireless subscriber units include wireless handsets 114, 118, 120, and 126, mobile computers 124 and 128, and desktop computers 116 and 122. During normal operations, each of these subscriber units communicates with one or more base stations during handoff among the base stations 102 through 112. Each of the subscriber units 114 through 128 and base stations 102 through 112 include RF circuitry constructed according to the present invention.

The RF circuitry formed according to the present invention may be formed to operate with any one of a number of different protocols and networks. For example, the network of FIG. 1A may be formed to be compatible with Bluetooth wireless technology that allows users to make effortless, wireless and instant connections between various communication devices such as notebook computers, desktop computers and mobile phones. Because Bluetooth systems use radio frequency transmissions to transfer both voice and data, the transmissions occur in real-time.

The Bluetooth specification provides for a sophisticated transmission mode that ensures protection from interference and provides security of the communication signals. According to most designs that implement the Bluetooth specifications, the Bluetooth radio is being built into a small microchip and is designed to operate in frequency bands that are globally available. This ensures communication compatibility on a worldwide basis. Additionally, the Bluetooth specification defines two power levels.

A first power level covers the shorter, personal area within a room and a second power level is designed for covering a medium range. For example, the second power level might be used to cover communications from one end of a building, such as a house, to the other. Software controls and identity coding are built into each microchip to ensure that only those units preset by the owners can communicate with each other. In general, it is advantageous to utilize low power transmissions and components that draw low amounts of power (especially for battery operated devices). The Bluetooth core protocols include Bluetooth-specific protocols that have been developed for Bluetooth systems. For example, the RFCOMM and TCS binary protocols have also been developed for Bluetooth but they are based on the ETSI TS 07.10 and the ITU-T recommendations Q.931 standards, respectively. Most Bluetooth devices require the Bluetooth core protocols, in addition to the Bluetooth radio, while the remaining protocols are only implemented when necessary.

The baseband and link control layers facilitate the physical operation of the Bluetooth receiver and, more specifically, the physical RF link between Bluetooth units forming a network. As the Bluetooth standards provide for frequency-hopping in a spread spectrum environment in which packets are transmitted in continuously changing defined time slots on defined frequencies, the baseband and link control layer utilizes inquiry and paging procedures to synchronize the transmission of communication signals at the specified frequency and clock cycles between the various Bluetooth devices.

The Bluetooth core protocols further provide two different types of physical links with corresponding baseband packets. A synchronous connection-oriented (SCO) physical link and an asynchronous connectionless (ACL) physical link may be implemented in a multiplexed manner on the same RF link. ACL packets are used for data only while the SCO packets may contain audio, as well as a combination of audio and data. All audio and data packets can be provided with different levels of error correction and may also be encrypted if required. Special data types, including those for link management and control messages, are transmitted on a specified channel.

There are other protocols and types of networks being implemented and that may be used with the network of FIG. 1A. For example, wireless networks that comport with service premises-based Wireless Local Area Network (WLAN) communications, e.g., IEEE 802.11a and IEEE 802.11b communications, and ad-hoc peer-to-peer communications, e.g., Bluetooth (as described above). In a WLAN system, the structure would be similar to that shown in FIG. 1A, but, instead of base stations 102 through 112, the WLAN system would include a plurality of Wireless Access Points (WAPs). Each of these WAPs would service a corresponding area within the serviced premises and would wirelessly communicate with serviced wireless devices. For peer-to-peer communications, such as those serviced in Bluetooth applications, the RF receiver of the present invention would support communications between peer devices, e.g., mobile computer 124 and wireless handset device 126. The fast growth of the mobile communications market and for networks as shown in FIG. 1A require the development of multi-band RF receivers that are small in size, low in cost, and have low power consumption. These RF receivers should be suitable for a high level of system integration on a single chip for reduced cost and miniaturized mobile device size. Low power consumption is very critical for increasing mobile device battery life, especially for mobile devices that include small batteries.

Generally, Bluetooth facilitates the fabrication of a low-cost and low-power radio chip that includes some of these protocols described herein. The Bluetooth protocol operates in the unlicensed 2.4 GHz Industrial Scientific Medical (ISM) band and, more specifically, transmits and receives on 79 different hop frequencies at a frequency in the approximate range of 2400 to 2480 MHz, switching between one hop frequency to another in a pseudo-random sequence. Bluetooth, in particular, uses Gaussian Phase Shift Keyed (GFSK) modulation. Its maximum data rate is approximately 721 kbits/s and the maximum range is up to 20–30 meters.

Even though Bluetooth has a much lower range and throughput than other known systems, its consequently significantly reduced power consumption means it has the ability to be much more ubiquitous. It can be placed in printers, keyboards, and other peripheral devices, to replace short-range cables. It can also be placed in pagers, mobile phones, and temperature sensors to allow information download, monitoring and other devices equipped with a Bluetooth access point. Nonetheless, it is advantageous to improve the low power consumption of Bluetooth devices to improve battery life for portable applications.

Similarly, wireless LAN technologies (such as those formed to be compatible with IEEE 802.11b) are being designed to complement and/or replace the existing fixed-connection LANs. One reason for this is that the fixed connection LANs cannot always be implemented easily. For example, installing wire in historic buildings and old buildings with asbestos components makes the installation of LANs difficult. Moreover, the increasing mobility of the worker makes it difficult to implement hardwired systems. In response to these problems, the IEEE 802 Executive Committee established the 802.11 Working Group to create WLAN standards. The standards specify an operating frequency in the 2.4 GHz ISM band.

The first IEEE 802.11 WLAN standards provide for data rates of 1 and 2 Mbps. Subsequent standards have been designed to work with the existing 802.11 MAC layer (Medium Access Control), but at higher frequencies. IEEE 802.11a provides for a 5.2 GHz radio frequency while IEEE 802.11b provides for a 2.4 GHz radio frequency band (the same as Bluetooth). More specifically, the 802.11b protocol operates in the unlicensed 2.4 GHz ISM band. Data is transmitted on binary phase shift keyed (BPSK) and quadrature phase shift keyed (QPSK) constellations at 11 Msps. 802.11b data rates include 11 Mbits/s, 5.5, 2 and 1 Mbits/s, depending on distance, noise and other factors. The range can be up to 100 m, depending on environmental conditions.

Because of the high throughput capability of 802.11b devices, a number of applications are more likely to be developed using 802.11b for networks such as that shown in FIG. 1A. These technologies will allow the user to connect to wired LANs in airports, shops, hotels, homes, and businesses in networks even though the user is not located at home or work. Once connected the user can access the Internet, send and receive email and, more generally, enjoy access to the same applications the user would attempt on a wired LAN. This shows the success in using wireless LANs to augment or even replace wired LANs.

The RF circuitry of the present invention is designed to satisfy at least some of the above mentioned standard-based protocols and may be formed in any of the subscriber units 114 through 128, base stations 102 through 112 or in any other wireless device, whether operating in a cellular system or not. The RF circuitry of the present invention includes low power designs that utilize CMOS technology and that support the defined protocols in a more efficient manner. Thus, for example, the teachings of the present invention may be applied to wireless local area networks, two-way radios, satellite communication devices, or other devices that support wireless communications. One challenge, however, with CMOS design in integrated circuits is that they typically utilize voltage sources having low values (e.g., 3 volts) and are generally noisy. It is a challenge, therefore, to develop receive and transmission circuitry that have full functionality while meeting these lower power constraints and while providing good signal quality. The system of FIGS. 1A and 1B include the inventive gain control circuitry which provides a plurality of gain settings according to a signal strength for a received RF signal and according to a signal strength of the received RF signal and interference.

Figure 1B:
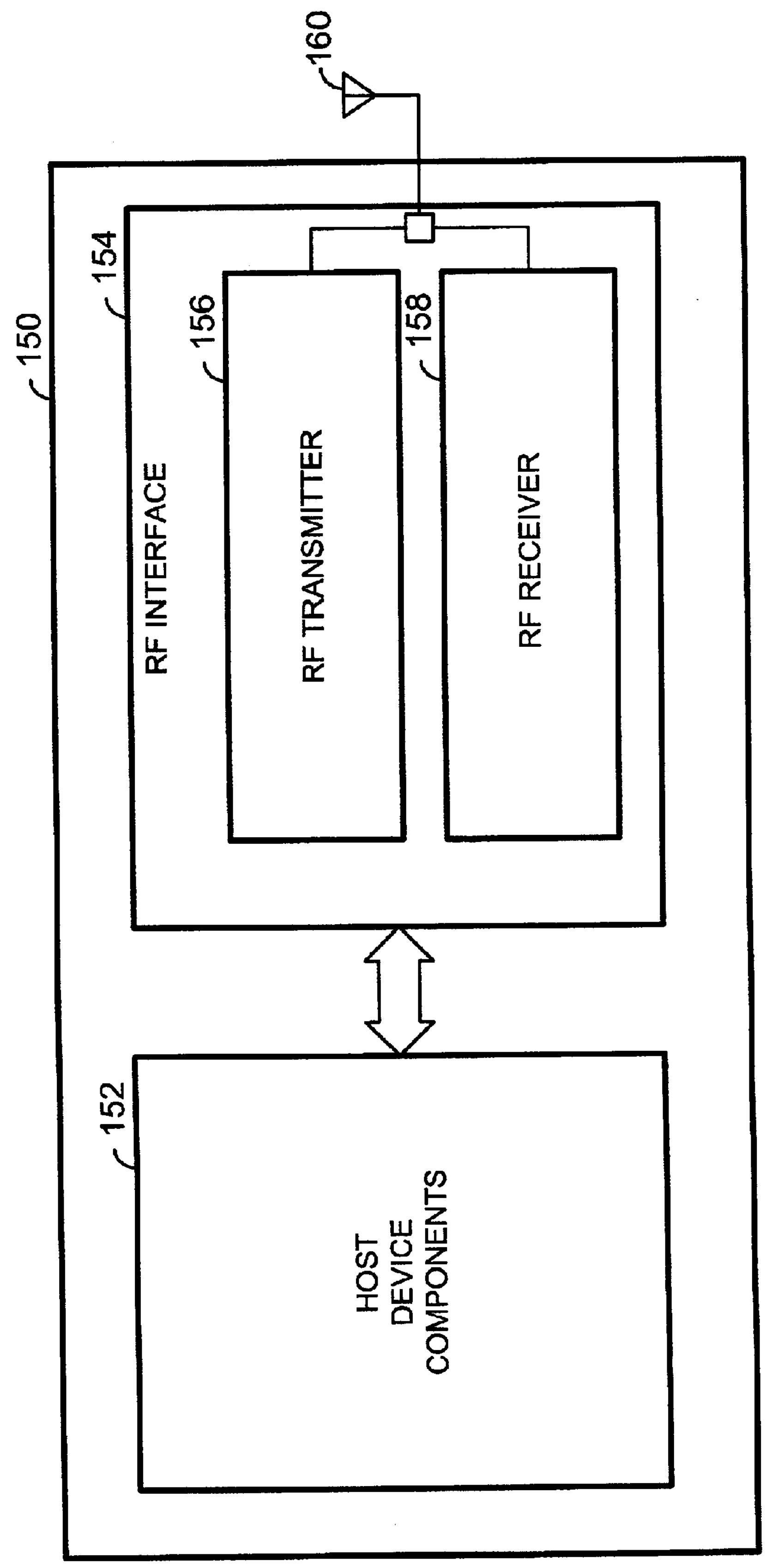
FIG. 1B is a block diagram generally illustrating the structure of a wireless device constructed according to the present invention.

FIG. 1B is a block diagram generally illustrating the structure of a wireless device 150 constructed according to the present invention. The general structure of wireless device 150 will be present in any of wireless devices 114 through 128 illustrated in FIG. 1A. Wireless device 150 includes a plurality of host device components 152 that service all requirements of wireless device 150 except for the RF requirements of wireless device 150. Of course, operations relating to the RF communications of wireless device 150 will be partially performed by host device components 152.

Coupled to host device components 152 is a Radio Frequency (RF) interface 154. RF interface 154 services the RF communications of wireless device 150 and includes an RF transmitter 156 and an RF receiver 158. RF transmitter 156 and RF receiver 158 both couple to an antenna 160. One particular structure of a wireless device is described with reference to FIG. 2. Further, the teachings of the present invention are embodied within RF transmitter 156 of RF interface 154.

The RF interface 154 may be constructed as a single integrated circuit. However, presently, the RF interface 158 includes an RF front end and a baseband processor. In the future, however, it is anticipated that many highly integrated circuits, e.g., processors, system on a chip, etc., will include an RF interface, such as the RF interface 154 illustrated in FIG. 1B. In such case, the receiver structure of the present invention described herein may be implemented in such devices.

Figure 2:
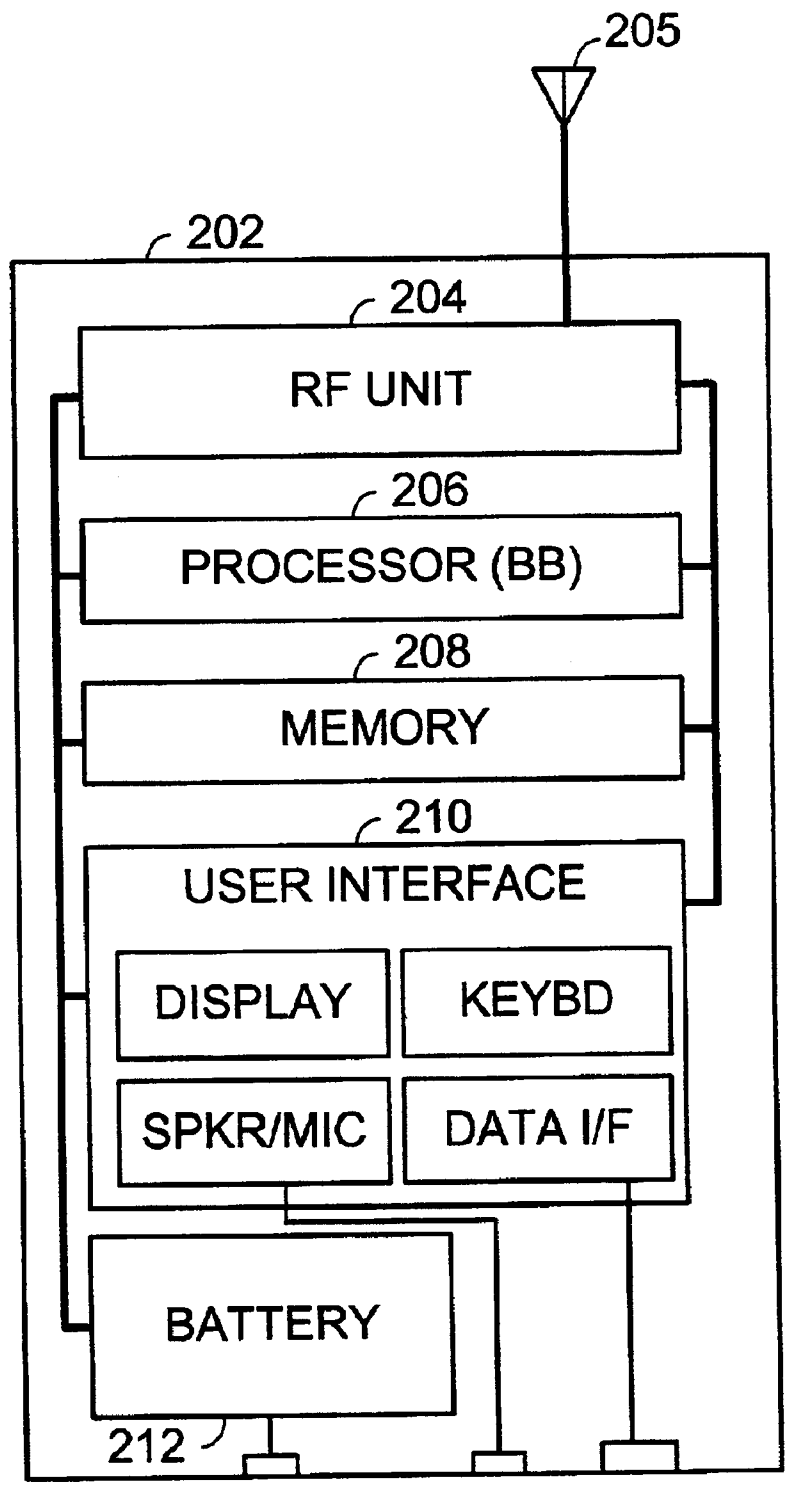
FIG. 2 is a block diagram illustrating a subscriber unit constructed according to the present invention.

FIG. 2 is a block diagram illustrating a subscriber unit 202 constructed according to the present invention. Subscriber unit 202 operates within a cellular system, such as the cellular system described with reference to FIG. 1A. Subscriber unit 202 includes an RF unit 204, a processor 206 that performs baseband processing and other processing operations, and a memory 208. RF unit 204 couples to an antenna 205 that may be located internal or external to the case of subscriber unit 202. Processor 206 may be an Application Specific Integrated Circuit (ASIC) or another type of processor that is capable of operating subscriber unit 202 according to the present invention. Memory 208 includes both static and dynamic components, e.g., Dynamic Random Access Memory (DRAM), Static Random Access Memory (SRAM), Read Only Memory (ROM), Electronically Erasable Programmable Read Only Memory (EEPROM), etc. In some embodiments, memory 208 may be partially or fully contained upon an ASIC that also includes processor 206. A user interface 210 includes a display, a keyboard, a speaker, a microphone, and a data interface, and may include other user interface components, as well. RF unit 204, processor 206, memory 208, and user interface 210 couple via one or more communication buses or links. A battery 212 is coupled to, and powers, RF unit 204, processor 206, memory 208, and user interface 210.

RF unit 204 includes the RF receiver components and operates according to the present invention to adjust the gain of an amplifier according to the amount of detected interference and according to the detected signal strength of the received RF or IF signal. The structure of subscriber unit 202, as illustrated, is only one particular example of a subscriber unit structure. Many other varied subscriber unit structures could be operated according to the teachings of the present invention. Further, the principles of the present invention may be applied to base stations, as are generally described with reference to FIG. 1A.

Figure 3:
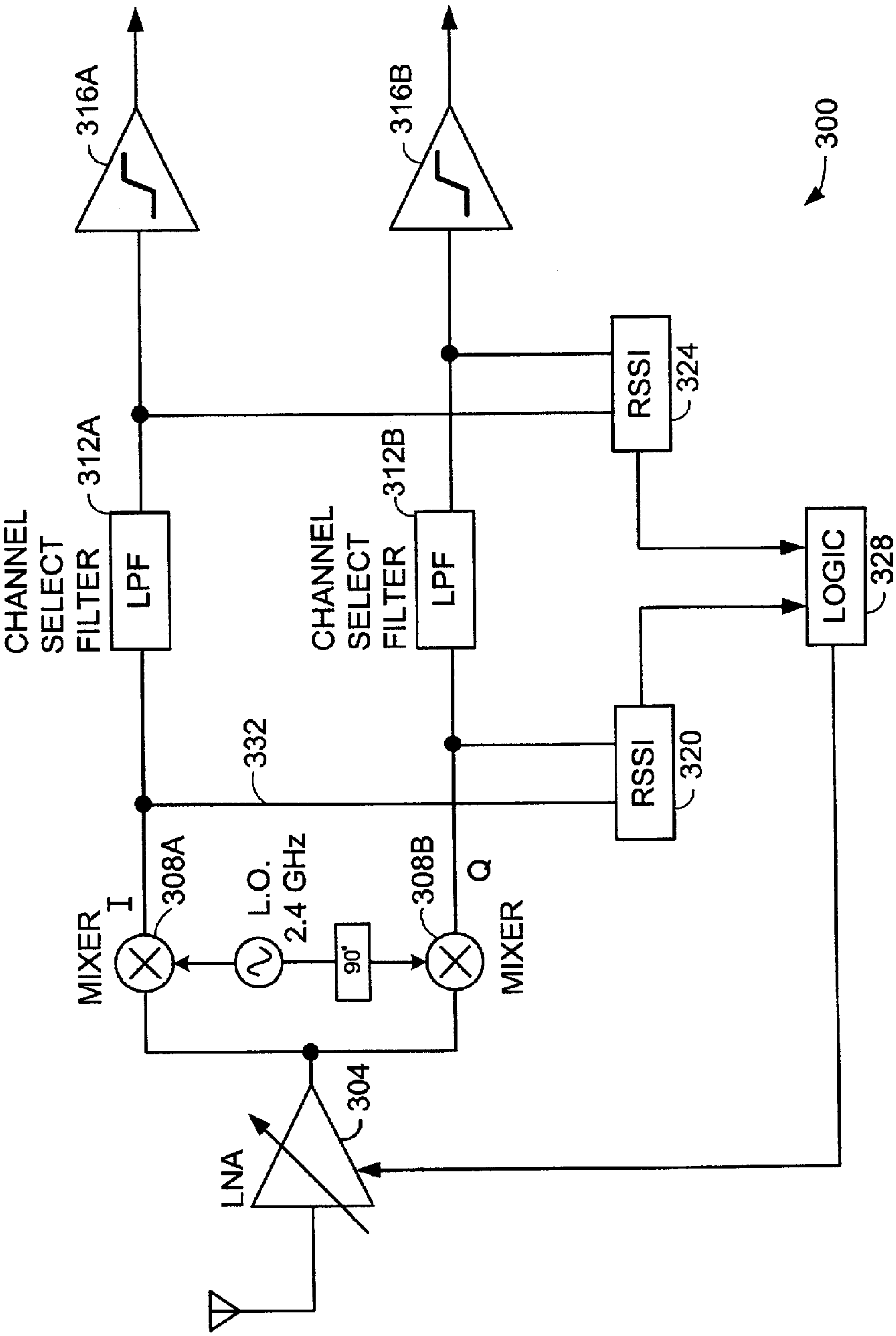
FIG. 3 is a functional schematic block diagram of a receiver portion of a radio receiver formed according to one embodiment of the present invention.

FIG. 3 is a functional schematic block diagram of a receiver portion of a radio receiver formed according to one embodiment of the present invention. The radio receiver 300 of FIG. 3 includes a low noise amplifier (LNA) 304 that is coupled to receive communication signals transmitted over a wireless medium. LNA 304 produces an amplified signal to a pair of mixers 308A and 308B, respectively. The mixers 308A and 308B down convert the amplified signal to a baseband frequency. Thereafter, the down converted signals at baseband frequencies are produced to a pair of low pass filters 312A and 312B, respectively, where a frequency corner is defined to exclude all signals and interference above a specified frequency. The low frequency signals that are not filtered are then produced to amplification circuitry 316A and 316B for the I and Q channels, respectively.

In general, it is desirable to provide maximum amplification for the received signals prior to providing the signals to the baseband processing circuitry. On the other hand, it is desirable to produce signals of a constant magnitude to the baseband processing circuitry. Accordingly, if an amplifier were tuned to maximize the gain for a low power signal that is received, then a high power signal would tend to saturate amplification circuitry 316A and 316B. On the other hand, if amplification circuitry 316A and 316B were merely tuned to amplify the strongest of the signals, then the amplification provided for weaker signals may not be sufficient.

Accordingly, an RF receiver formed in an integrated circuit includes circuitry for determining a proper amplification level of an amplifier having a plurality of gain levels that enables the receiver to respond in a manner that corresponds to the signal strength of the received signal as well as to the signal strength of any detected interference. To achieve this, a pair of RSSIs are coupled in parallel to each of two branches of a radio receiver circuit carrying I and Q modulated channels. Based upon the detected readings of the RSSIs, logic circuitry determines what the proper amplification levels should be for the front end amplification circuitry, here, LNA 304, to maximize signal amplification without saturating downstream amplification circuitry 316A and 316B.

More specifically, a first RSSI 320 is coupled to detect a wideband channel, meaning that it detects not only the signal strength of the initially received and desired signal, but also of any interference signals in adjacent channels. A second RSSI 324 is coupled to detect only the signal strength of the desired signal after the desired communication signals have been transmitted through low pass filters 312A and 312B to eliminate interference in the adjacent channels. Thus, RSSI 320 can detect the total signal power that includes the signal power for the desired signal, as well as the interference signals, while RSSI 324 determines the signal power of a desired signal only. Logic circuitry 328, being coupled to receive the signal strength indications from RSSI 320 and RSSI 324, is able to determine an appropriate gain level for LNA 304 in response to the determined signal strengths.

Logic circuitry 328 adaptively controls gain to optimize signal amplification in a manner that provides for best sensitivity and best linearity in response to a binary output of RSSI 320 and RSSI 324. In general, logic circuitry 328 responds to a plurality of conditions. If the desired signal is strong, logic circuitry 328 provides control signals to LNA 304 to attenuate the received signal by 32 dB relative to maximum amplification in response to the strong desired signal. On the other hand, if the received signal strength indicator from RSSI 324 indicates that the desired signal is weak or moderate but the interference is strong, the gain is reduced by 6 dB. The third case, wherein both the RSSI 320 and RSSI 324 indicate that the interference, as well as the signal strength of the desired signal, is low, logic circuitry 328 provides control signals to LNA 304 to prompt it to provide maximum amplification. In other words, it is not directed to reduce its output gain either by 6 dB or by 32 dB relative to maximum amplification as described above.

Figure 4A:
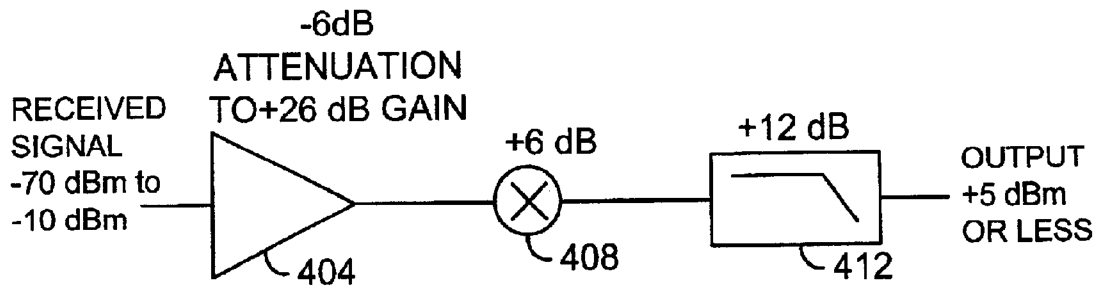
FIG. 4A is an illustration that shows the gain at the various stages of the receiver circuitry.
Figure 4B:
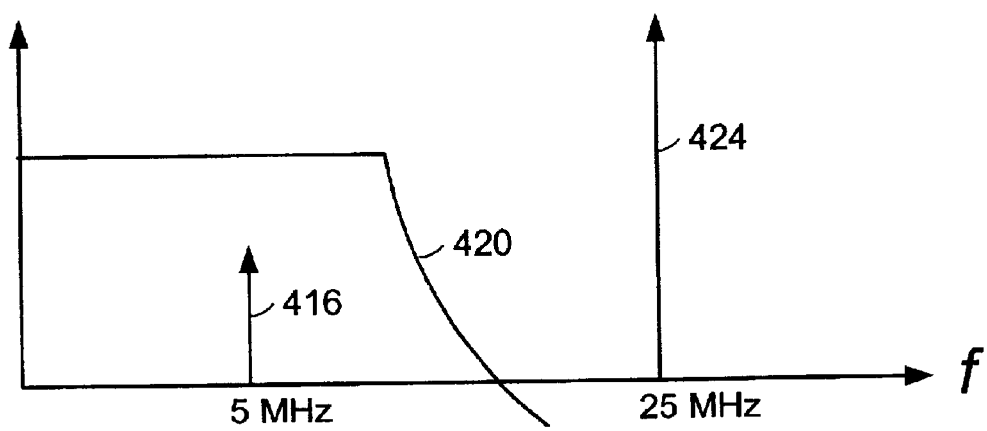
FIG. 4B is an illustration that introduces part of the interference issues that must be considered by a designer.
Figure 4C:
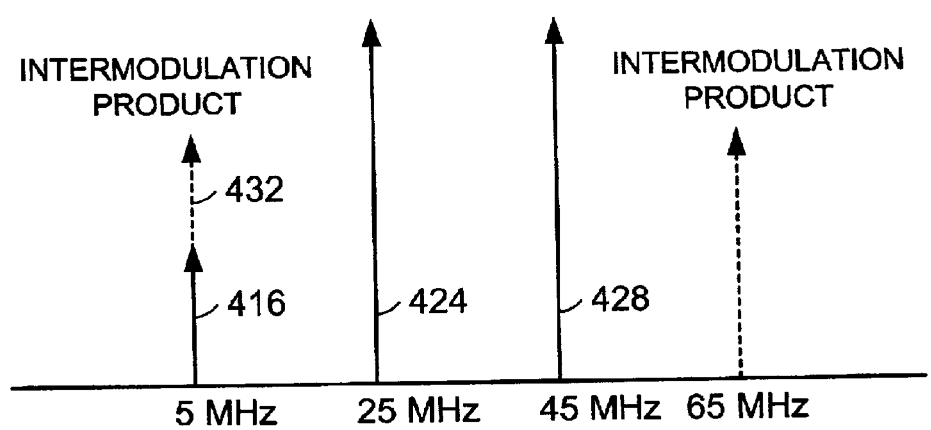
FIG. 4C is an illustration that shows an example of signals in adjacent channels providing intermodulation interference.

FIGS. 4A, 4B and 4C are illustrations that show the operation of one embodiment of the present invention and corresponding design issues. Referring now to FIG. 4A, a received signal can range in amplitude from −70 dBm to a −10 dBm. Accordingly, the received signal having the specified amplitude range is input into a low noise amplifier (LNA) 404 that can provide a maximum of 26 dB of gain. LNA 404 also is capable of attenuating (reducing) the gain or signal strength of a received signal if the signal strength of the received signal is too high.

The output of LNA 404 is produced to a mixer 408 that down converts the received signal from either RF or IF to a baseband frequency and also provides a constant value of amplification. Here, the output of LNA 404 is produced to mixer 408 that provides, in the described embodiment of the invention, 6 dB of gain.

The output of mixer 408 is then provided to a low pass filter 412 that blocks or reduces signals above a defined high frequency corner and that provides an additional 12 dB of gain. As may be seen, therefore, a constant gain of 18 dB is introduced by mixer 408 and low pass filter 412. In the present embodiment of the invention, however, the output desirably has a signal strength of 5 dBm or less. Accordingly, because the cumulative gain of mixer 408 and the low pass filter 412 is 18 dB, LNA 404 must be adjusted so that it attenuates or amplifies according to the received signal strength. Generally, however, 5 dBm is an expected output level and also is a maximum output level. The tolerance in the described embodiment of the invention, however, is 3 dB. Accordingly, an output gain from downstream amplifiers of 2 dBm or less is provided by design so that if the output signal level is 3 dBm too high, the absolute maximum of 5 dBm is not exceeded.

The illustration of FIG. 4A is one that shows the gain at the various stages of the receiver circuitry. Because LNA 404 may also receive intermodulation interference, however, the gain of LNA 404 must be adjusted in response to the received signal strength of the desired signal, as well as the interference, while keeping in mind the gain provided by mixer 408 and low pass filter 412.

FIG. 4B illustrates some of the interference issues that must be considered by a designer. As may be seen, a band (communication channel) 420 is centered about a 5 MHz signal. A communication signal 416 that is centered at 5 MHz is the desired communication signal. Band 420 is characterized by a high frequency corner that is located above 5 MHz. An interference signal 424 is shown at 25 MHz. Generally, interference signal 424 is a communication signal in an adjacent channel. As may be seen, interference signal 424 is well outside of the defined band 420 and is therefore eliminated and does not provide interference with the desired communication signal 416. This does not mean, however, that interference signals such as interference signal 424 cannot have an effect on communication signals within band 420. If a plurality of interference signals exists in adjacent channels, then an intermodulation product may create intermodulation interference within band 420 wherein the intermodulation interference provides interference with desired communication signal 416.

Referring now to FIG. 4C, an example of signals in adjacent channels providing intermodulation interference may be seen. Generally, when there are large interference signals in two adjacent channels, the third order intermodulation product will generate four sum and difference signals. Of these four signals, three signals are well beyond the pass band of the channel select filter and can be ignored for this discussion (see FIG. 2). The fourth intermodulation interference signal is 2*f1–f2 which produces an interference signal at the same frequency as the desired signal. The inventive circuit is designed to block the interference from third order intermodulation products. When the interference level exceeds approximately −40 dBm, the RSSI 1 output exceeds the predetermined threshold level, thereby reducing the LNA gain by 6 dB to improve the receiver rejection of third order intermodulation products.

Referring again to FIG. 4C, a desired communication signal 416 is shown at the 5 MHz frequency within FIG. 4C as it was in FIG. 4B. Additionally, an interference signal 424 is shown at the 25 MHz frequency. Additionally, an interference signal 428 is shown at the 45 MHz frequency. As is known by those of average skill in the art, interference signal 424 and interference signal 428 produce an intermodulation product at 5 MHz and at 65 MHz. Thus, the intermodulation product at 65 MHz is not of interest because it is outside of band 420. The intermodulation product within band 420 at the 5 MHz frequency, however, is of great interest. As may be seen, an intermodulation product 432 is shown to be on top of the desired signal 416 at the 5 MHz frequency. Accordingly, the present invention contemplates adjustments to the gain settings of the low noise amplifier at the input stage of the receiver circuitry according to the signal strength of the desired signal, as well as to the signal strength of the interference signals as evidenced by the presence, or lack of presence, of an intermodulation product, such as intermodulation product 432.

Figure 5:
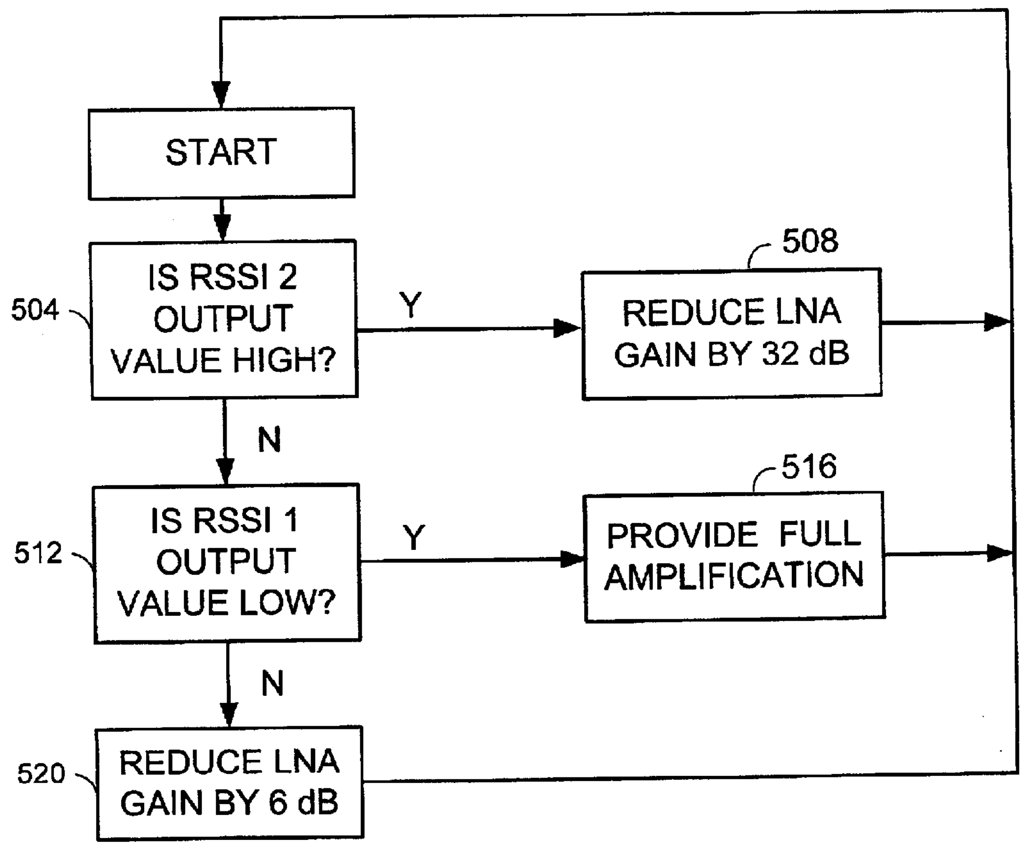
FIG. 5 is a flowchart that illustrates a method for setting a gain level of a low noise amplifier at an input stage of a receiver according to one embodiment of the present invention.

FIG. 5 is a flowchart that illustrates a method for setting a gain level of a low noise amplifier at an input stage of a receiver according to one embodiment of the present invention. The method of FIG. 5 may be understood if viewed in relation to the system of FIG. 3 although the method of FIG. 5 is not intended to be limited to the structure of FIG. 3. Referring again to FIG. 3, RSSI 320 shall be referred to here in FIG. 5 as RSSI 1, and RSSI 324 shall be referred to here in FIG. 5 as RSSI 2. Generally, RSSI 1 is coupled to receive a signal produced by a mixer prior to being filtered by a low pass filter. This means, of course, that it detects the received signal strength for a wide band. RSSI 2, however, is coupled to receive the output of a low pass filter thereby meaning that it will determine the received signal strength only for a low frequency band signal.

Referring again to FIG. 5, the first step of the inventive method is determining whether RSSI 2 has detected a signal with high signal strength (step 504). Generally, the method of FIG. 5 is described in binary terms. It is understood, however, that multiple levels may be defined. The specific threshold about which the various analyses are performed are subject to designer discretion. Thus, what constitutes a high output value for RSSI 2 is one that may readily be determined by the system designer. If RSSI 2 did detect a signal with a high signal strength value, the logic circuitry generates control signals to reduce the LNA gain by 32 dB from its maximum gain setting (step 508). Thereafter, the process is repeated.

On the other hand, if RSSI 2 did not detect a signal with a high signal strength value, then the logic circuitry determines whether RSSI 1 detected a high signal strength (step 512). Here, the threshold that is used to determine whether the detected signal has high signal strength is a different threshold from that of step 504. Again, the threshold is one that may readily be specified by the system designer. If the RSSI 1 output value was not high, then the LNA gain is not adjusted from its maximum setting and full amplification is provided (step 516). If, however, the RSSI 1 output value is high, meaning that intermodulation interference has been detected, then the logic device generates control signals to the low noise amplifier to prompt it to reduce its gain from its maximum gain value by 6 dB (step 520). After steps 516 and 520, the process is repeated.

The method of FIG. 5 is repeated continuously to determine the best gain setting for the LNA according to current circuit conditions. Thus, a new influence from intermodulating interference signals or a new gain level for the desired signal would be rapidly detected and the gain level of the LNA would be correspondingly adjusted in a manner similar to that described herein.

Figure 6:
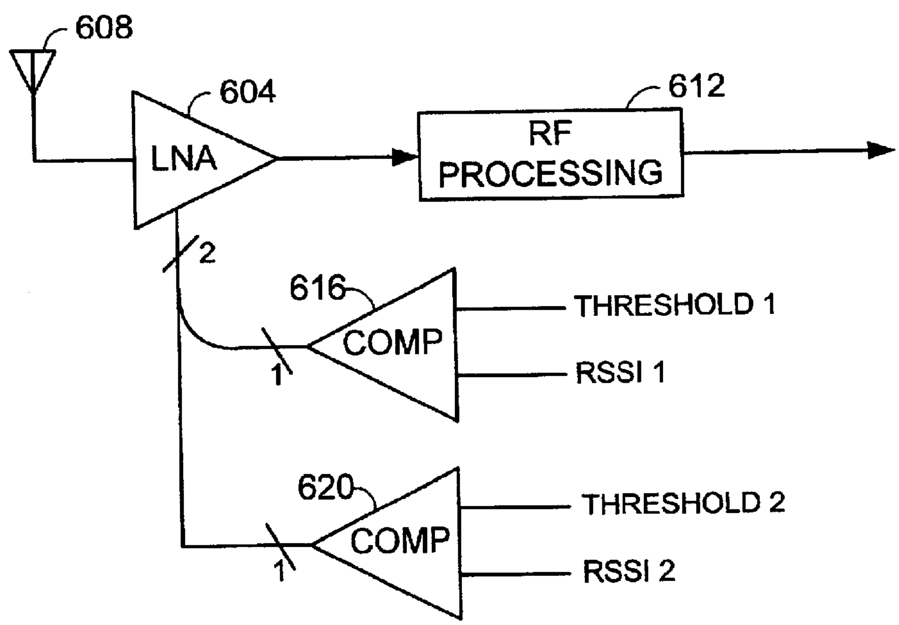
FIG. 6 is a functional block diagram that illustrates the logical operation of the present invention.

FIG. 6 is a functional block diagram that illustrates the logical operation of the present invention. As may be seen, a low noise amplifier 604 is coupled to receive radio frequency signals from an antenna 608. LNA 604 produces an amplitude output to RF processing circuitry 612. RF processing circuitry 612 down converts the received signal to a low frequency value to define a baseband frequency channel. LNA 604 also receives control signals from comparators 616 and 620. Responsive to the control signals from comparators 616 and 620, LNA 604 adjusts its gain. Comparator 616 receives a threshold value and an RSSI 1 signal (desired signal and interference) strength value. Based upon the comparison of those two signals, comparator 616 generates a binary value to LNA 604. Similarly, comparator 620 receives a second threshold value and a second signal strength indication from RSSI 2 reflecting signal strength for the desired signal. Based upon that comparison, comparator 620 produces a binary value to LNA 604. Based upon the pattern of the one-bit binary values received from comparators 616 and 620, LNA 604 adjusts its gain to one of three different settings. In the described embodiment, the three settings are 0 dB of attenuation, 6 dB of attenuation and 32 dB of attenuation from a maximum amplification setting.

In operation, if the received signal strength from comparator 620 exceeds the second threshold value, comparator 620 generates a logic 1. Responsive to the logic 1, LNA 604 attenuates its output by 32 dB from its maximum setting regardless of whether it receives a logic 1 or logic 0 from comparator 616. In general, a logic 1 from comparator 620 indicates that the desired signal strength is high and that attenuation must occur to prevent saturation of the output stages of the receiver system. If, however, the second RSSI reading is below the second threshold, then the LNA gain adjustment will either be 0 dB or −6 dB relative to a maximum gain of LNA 604 according to whether the received signal strength of the first RSSI is greater than or less than the first threshold.

As is known by those of average skill in the art, the standards provide for a 6 dB decrease in sensitivity when a large interference signal is present. Accordingly, because of the relaxed sensitivity, LNA 604 need only reduce its gain by 6 dB if the presence of an interference signal resulting from intermodulation interference is detected. If the signal of interest is low and there is no intermodulation interference that is detected or, more specifically, the sum of the desired signal and the detected intermodulation interference is below the first threshold value, then comparator 616 produces a logic 0 thereby prompting LNA 604 to not attenuate relative to its maximum gain setting.

Figure 7:
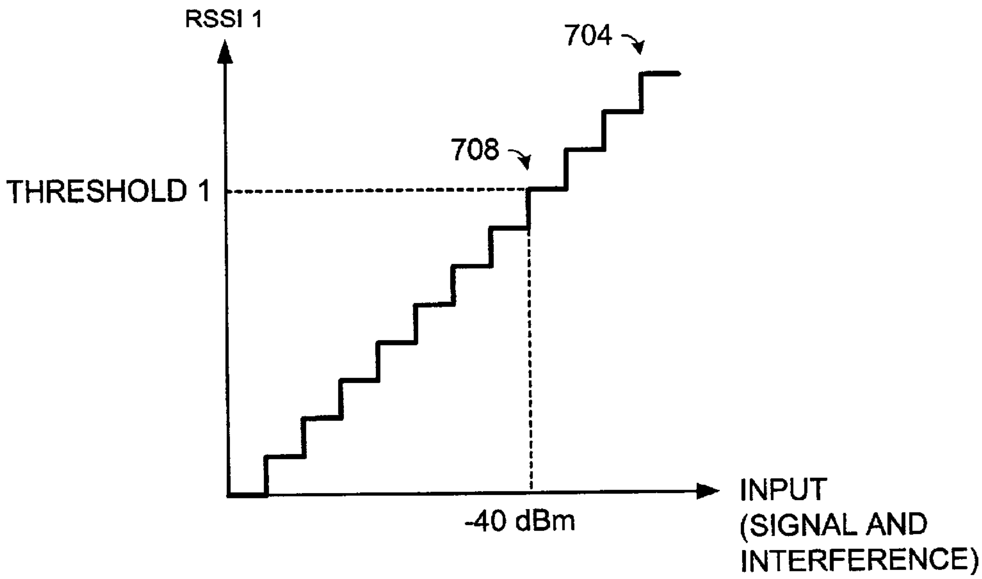
FIG. 7 is a graph that illustrates the operation of the system of FIG. 6.

FIG. 7 is a graph that illustrates the operation of the system of FIG. 6 for comparator 616. As may be seen, an output of RSSI 1 is plotted on the vertical access versus an interference threshold limit on the horizontal access. As may be seen, FIG. 7 illustrates that for a specified interference level of −40 dBm, an RSSI output curve, shown generally at 704, intersects a specified interference level at a point shown generally at 708. By translating point 708 horizontally, the specified threshold level for RSSI 1 may be determined. The actual value is, in part, a function of the RSSI and the characteristics of its output curve 704.

Figure 8:
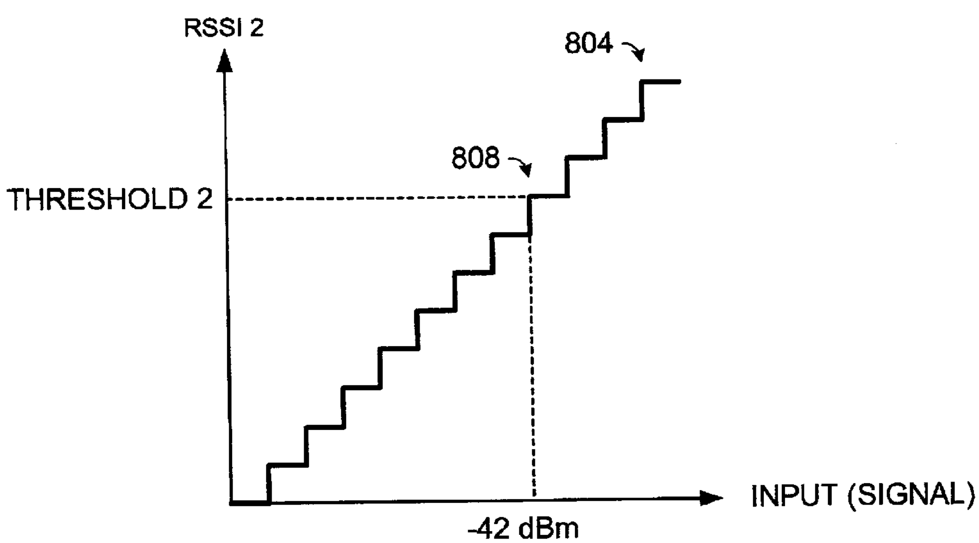
FIG. 8 is a graph that illustrates an output curve of the system of FIG. 6.

Similarly, RSSI 2 has a response curve shown in FIG. 8. The primary difference is that the interference level for RSSI 2 is equal to −42 dBm. Accordingly, by determining the intersection with an RSSI 2 output curve 804 and, more specifically, observing the intersection point shown generally at 808, one may determine the threshold level on a vertical access for RSSI 2.

The invention disclosed herein is susceptible to various modifications and alternative forms. Specific embodiments therefore have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

What is claimed is:

1. A receiver, comprising:

an input port for receiving wireless communication signals;

amplification circuitry coupled to receive a wireless communication signal from the input port, the amplification circuit for amplifying the received signal, wherein the amplification circuitry is operable to:

amplify the received signal to a first amplification level if no interference signals are detected having a signal strength that exceeds a first threshold value and a desired signal gain for the received signal is below a second threshold value;

amplify the received signal to a second amplification level if an interference signal is detected having a signal strength that exceeds the first threshold value and the desired signal gain for the received signal is below the second threshold value;

amplify the received signal to a third amplification level if a desired signal gain for the received signal is above the second threshold value; and down conversion circuitry, coupled to the amplifier circuitry, for down converting the amplified received signal.

2. The receiver of claim 1 wherein the first amplification level is full amplification.

3. The receiver of claim 1 wherein the first amplification level is equal to 26 dB.

4. The receiver of claim 1 wherein the second amplification level is equal to 6 dB less than full amplification.

5. The receiver of claim 1 wherein the second amplification level is equal to 20 dB.

6. The receiver of claim 1 wherein the third amplification level is equal to 32 dB less than full amplification.

7. The receiver of claim 1 wherein the third amplification level is equal to 6 dB of attenuation.

8. The receiver of claim 1 further including a pair of received signal strength indicator circuits (RSSIs) wherein a first RSSI is coupled to detect a combination of the desired signal and interference.

9. The receiver device of claim 8 wherein a second RSSI is coupled to detect a signal strength of the received communication signal.

10. A receiver, comprising:

a low noise amplifier (LNA) coupled to receive wireless communication signals from an antenna and also coupled to receive control signals that specify a corresponding gain level; and logic circuitry coupled to produce the control signals to the LNA according to the signal strength of the received communication signals and interference in adjacent channels and also coupled to receive an indication of the signal strength of the received signals wherein:

the control signal is operable to prompt the LNA to provide maximum gain if the received signal strength indications from the first and second received signal strength indicators (RSSIs) are below a first and a second threshold, respectively;

the control signal is operable to prompt the LNA to provide less than maximum gain if the received signal strength indications from the first and second RSSIs are above the first threshold and below the second threshold, respectively; and the control signal is operable to prompt the LNA to provide attenuation to the received signal if the received signal strength indications from the second RSSI is above the second threshold.

11. The receiver of claim 10 further including a first and a second received signal strength indicator (RSSI) coupled to produce received signal strength indications to the logic circuitry.

12. The receiver of claim 11 further including down conversion and oscillation circuitry for down converting the received signal to a base band frequency wherein the first RSSI is coupled to receive a wide band signal including the down converted signals in the baseband and signals that exist in neighboring channel bands.

13. The receiver of claim 12 further including a low pass filter that is also coupled to receive the down converted signals, the low pass filter defining a corner frequency located approximately at an upper end of the baseband communication channel for filtering signals whose frequency is above the corner.

14. The receiver of claim 13 wherein the second RSSI is coupled to received a low pass filtered output from the low pass filter wherein the second RSSI produces a signal strength indicator reflecting the signal strength for the received communication signals.

15. The receiver of claim 14 wherein the logic circuitry produces a command to prompt the LNA to reduce its gain from its maximal gain amount by 32 dB if the received signal strength indication from the second RSSI is greater than −40 dBm.

16. The receiver of claim 14 wherein the logic circuitry produces a command to prompt the LNA to reduce its gain from its maximal gain amount by 6 dB if the received signal strength indication from the second RSSI is less than or equal to −42 dBm and the received signal strength indication from the first RSSI is greater than −40 dBm.

17. The receiver of claim 14 wherein the logic circuitry produces a command to prompt the LNA to amplify to its maximal gain amount if the received signal strength indication from the second RSSI is less than or equal to −42 dBm and the received signal strength indication from the first RSSI is less than or equal to −40 dBm.

18. A method for adjusting a gain level for a low noise amplifier at the front end of a receiver circuit formed on an integrated circuit, comprising:

determining if a gain of a received communication signal exceeds a first specified threshold;

if the gain of the received communication signal exceeds the first specified threshold, attenuating the received communication signal by a first attenuated amount;

determining if a combination of the received communication signal and any interference signals from neighboring communication channels exceeds a second threshold; and amplifying the received signal a maximum amount only if the gain of the desired signal is below the first threshold and gain of the combination of the received communication signal and any interference signals from neighboring communication channels is equal to or less than a second threshold.

19. The method of claim 18 wherein the first threshold is equal to a minus 42 dBm.

20. The method of claim 18 wherein the second threshold is equal to a minus 40 dBm.

21. The method of claim 18 wherein the first attenuated amount is equal to 32 dBm of attenuation relative to full amplification.

22. The method of claim 18 further including the step of, if the gain of the received communication signal is less than the first threshold amount, determining whether to produce a signal having a second attenuation value relative to full amplification.

23. The method of claim 22 wherein the second attenuation value is equal to 6 dBm.

* * * * *